United States Patent
Yagoshi

(10) Patent No.: US 9,628,058 B2
(45) Date of Patent: Apr. 18, 2017

(54) SKEW CORRECTION CIRCUIT, ELECTRONIC DEVICE, AND SKEW CORRECTION METHOD

(71) Applicant: FUJITSU LIMITED, Kawasaki-shi, Kanagawa (JP)

(72) Inventor: Teruaki Yagoshi, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/189,689

(22) Filed: Jun. 22, 2016

(65) Prior Publication Data

US 2017/0026033 A1    Jan. 26, 2017

(30) Foreign Application Priority Data

Jul. 22, 2015  (JP) .................. 2015-144774

(51) Int. Cl.
  *H03K 5/12* (2006.01)
  *H03K 5/26* (2006.01)

(52) U.S. Cl.
  CPC ............. *H03K 5/12* (2013.01); *H03K 5/26* (2013.01)

(58) Field of Classification Search
  CPC .................. H03K 5/12; H03K 5/26
  USPC ........ 327/2, 3, 170, 171, 231, 233, 234, 235
  See application file for complete search history.

(56) References Cited

U.S. PATENT DOCUMENTS

| 6,114,890 A * | 9/2000 | Okajima ............... H03L 7/0805 327/170 |
| 2004/0125902 A1 | 7/2004 | Nishimura et al. |
| 2006/0244505 A1* | 11/2006 | Fung ................. G06F 1/10 327/293 |
| 2010/0295591 A1* | 11/2010 | Asmanis ........... H04L 25/03878 327/276 |

FOREIGN PATENT DOCUMENTS

| JP | 2003-110422 | 4/2003 |
| JP | 2004-207794 | 7/2004 |

* cited by examiner

*Primary Examiner* — William Hernandez
(74) *Attorney, Agent, or Firm* — Staas & Halsey LLP

(57) ABSTRACT

A skew correction circuit includes: a phase-difference detection circuit that generates a phase difference signal indicating a phase difference between an edge of a first signal that is one signal of differential signals and an edge of a second signal that is another signal of the differential signals; and a correction-signal generation circuit that generates a correction signal having an inverted phase of the second signal by combining the phase difference signal and the first signal.

5 Claims, 8 Drawing Sheets

SKEW CORRECTION CIRCUIT, ELECTRONIC DEVICE, AND SKEW CORRECTION METHOD

CROSS-REFERENCE TO RELATED APPLICATION

This application is based upon and claims the benefit of priority of the prior Japanese Patent Application No. 2015-144774, filed on Jul. 22, 2015, the entire contents of which are incorporated herein by reference.

FIELD

The embodiments discussed herein are related to a skew correction circuit, an electronic device having the skew correction circuit, and a skew correction method.

BACKGROUND

A skew correction circuit for correcting skew between two signals has been known. In one example, a skew correction circuit has a phase comparator and an integration circuit and is connected to a signal generation circuit having a first signal generation circuit, a second signal generation circuit, and a delay circuit. The first signal generation circuit in the signal generation circuit generates a reference signal, and the second signal generation circuit in the signal generation circuit generates a comparison signal. The phase comparator in the skew correction circuit outputs a phase difference between the reference signal and the comparison signal, and the integration circuit in the skew correction circuit integrates a signal output from the phase comparator and outputs a signal proportional to the phase difference to the delay circuit in the signal generation circuit. Based on a delay time generated by integrating the phase difference between the reference signal and the comparison signal, the skew correction circuit delays the comparison signal generated by the second signal generation circuit to thereby correct skew between a signal generated by the first signal generation circuit and a signal generated by the second signal generation circuit.

Other known examples include a system using a multi-stage gate circuit to correct a delay time of data, a system using a flip-flop circuit, a system using a phase-locked loop circuit, and a system using a differentiation or integration circuit to perform phase correction.

Differential signals having a positive signal and a negative signal with an inverted phase of the positive signal are used during communication of information through a transmission path, such as during communication between large scale integration (LSI) circuits. During communication of differential signals from a transmitting circuit to a receiving circuit through a transmission path, skew may occur between the positive signal and the negative signal of the differential signals received by the receiving circuit, for example, owing to a difference between the length of a transmission line through which the positive signal is transmitted and the length of a transmission line through which the negative signal is transmitted. Since there is a possibility that erroneous information is communicated owing to the skew between the positive signal and the negative signal of the differential signals, it is desirable to correct the skew between the positive signal and the negative signal of the differential signals.

The followings are reference documents.
[Document 1] Japanese Laid-open Patent Publication No. 2003-110422 and
[Document 2] Japanese Laid-open Patent Publication No. 2004-207794.

SUMMARY

According to an aspect of the invention, a skew correction circuit includes: a phase-difference detection circuit that generates a phase difference signal indicating a phase difference between an edge of a first signal that is one signal of differential signals and an edge of a second signal that is another signal of the differential signals; and a correction-signal generation circuit that generates a correction signal having an inverted phase of the second signal by combining the phase difference signal and the first signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

A skew correction circuit, an electronic device, and a skew correction method according to the present disclosure will be described below with reference to the accompanying drawings. The technical scope of the present disclosure is not limited to embodiments thereof.

(Overview of Skew Correction Circuit According to Embodiment)

In a skew correction circuit according to one embodiment, a phase-difference detection circuit and a correction-signal generation circuit correct, each including a single operational amplifier and a plurality of resistance elements, correct skew between differential signals. The skew correction circuit according to the embodiment may correct skew between differential signals by using a simple circuit configuration compared with that of the phase correction circuit of the related art.

(Configuration and Functions of Skew Correction Circuit According to Embodiment)

Figure 1:
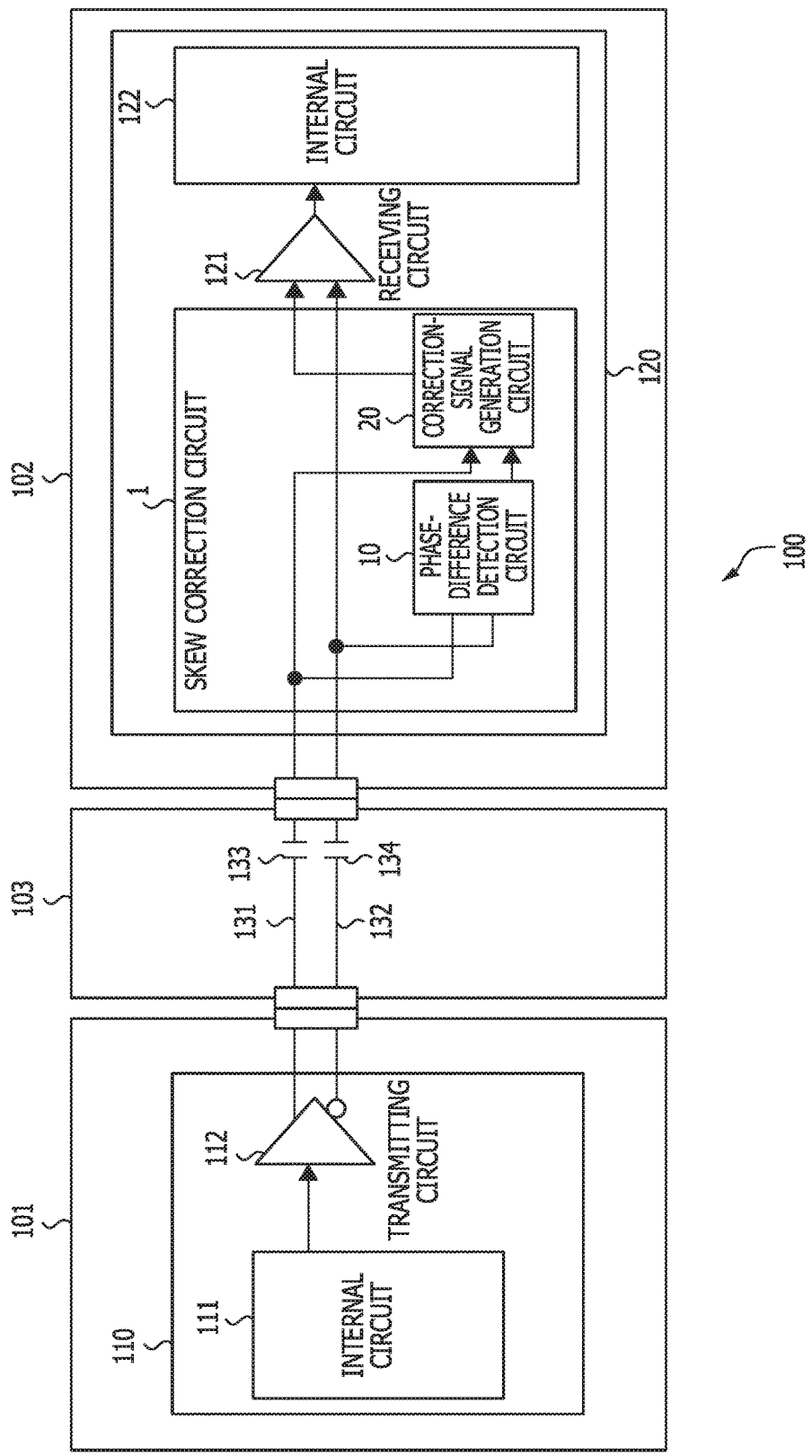
FIG. 1 is a circuit block diagram of a communication system including a receiving circuit having a skew correction circuit according to an embodiment.

FIG. 1 is a circuit block diagram of a communication system including a receiving circuit having a skew correction circuit according to an embodiment.

A communication system 100 includes a first substrate 101, a second substrate 102, and a transmission path 103. The communication system 100 has various functions and is a server in one example. One example of each of the first substrate 101 and the second substrate 102 is a module substrate detachable from a substrate-mounted device.

The first substrate 101 includes a transmitting-end integrated circuit (IC) 110. The transmitting-end IC 110 has a first internal circuit 111 and a transmitting circuit 112. Digital signals from the first internal circuit 111 are input to the transmitting circuit 112, and the transmitting circuit 112 outputs the digital signals to the transmission path 103 as differential signals.

The second substrate 102 includes a receiving-end IC 120. The receiving-end IC 120 has a skew correction circuit 1, a receiving circuit 121, and a second internal circuit 122. The skew correction circuit 1 has a phase-difference detection circuit 10 and a correction-signal generation circuit 20. The skew correction circuit 1 corrects skew between a positive signal and a negative signal of the differential signals transmitted from the transmitting circuit 112 through the transmission path 103 and outputs the corrected differential signals to the receiving circuit 121. Hereinafter, the positive signal of the differential signals may be referred to as a "first signal", and the negative signal of the differential signals may be referred to as a "second signal". The receiving circuit 121 outputs, to the second internal circuit 122, digital signals corresponding to the differential signals corrected by the skew correction circuit 1.

The transmission path 103 has a first transmission line 131 through which the first signal is transmitted and a second transmission line 132 through which the second signal is transmitted. A first coupling capacitor 133 is connected to the first transmission line 131, and a second coupling capacitor 134 is connected to the second transmission line 132.

Figure 2:
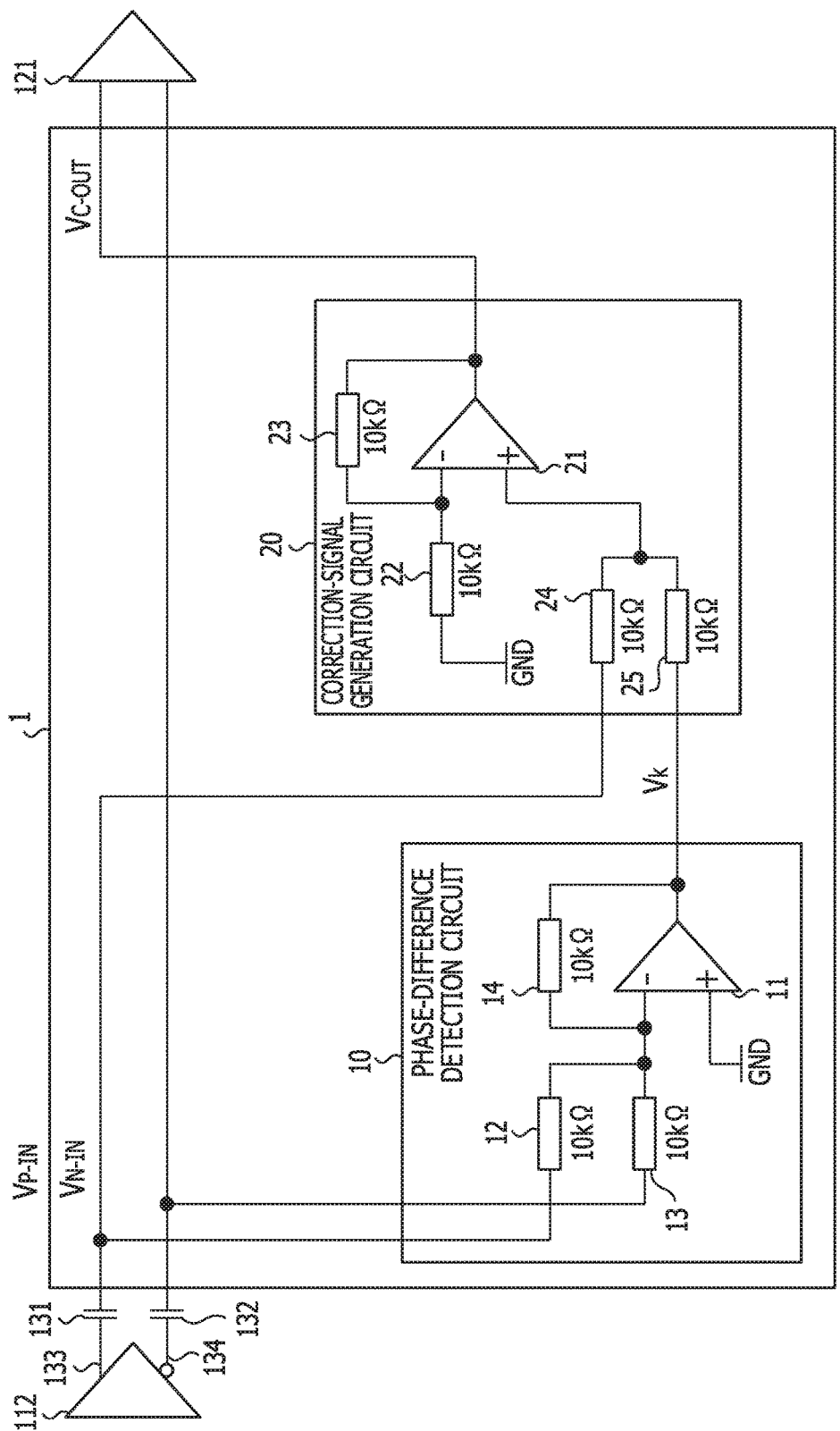
FIG. 2 is a more detailed internal circuit block diagram of the skew correction circuit according to the embodiment.

FIG. 2 is a more detailed internal circuit block diagram of the skew correction circuit 1.

The phase-difference detection circuit 10 has a detection operational amplifier 11, a first detection resistance element 12, a second detection resistance element 13, and a third detection resistance element 14. The first detection resistance element 12, the second detection resistance element 13, and the third detection resistance element 14 have the same resistance value, and in one example, the resistance value of each of the first detection resistance element 12, the second detection resistance element 13, and the third detection resistance element 14 is 10 kΩ. A first input terminal of the detection operational amplifier 11 is connected to ground, one end of each of the first detection resistance element 12, the second detection resistance element 13, and the third detection resistance element 14 is connected to a second input terminal of the detection operational amplifier 11, and an output terminal of the detection operational amplifier 11 is connected to another end of the third detection resistance element 14 and the correction-signal generation circuit 20. Another end of the first detection resistance element 12 is connected to the first transmission line 131, and another end of the second detection resistance element 13 is connected to the second transmission line 132.

The phase-difference detection circuit 10 is an adding circuit that adds a first signal $V_{P-IN}$, which is one signal of the differential signals, and a second signal $V_{N-IN}$, which is another signal of the differential signals, to thereby generate a phase difference signal $V_k$ indicating a phase difference between an edge of the first signal $V_{P-IN}$ and an edge of the second signal $V_{N-IN}$. The phase-difference detection circuit 10 executes a computational operation given by:

$$V_k = -(V_{P-IN} + V_{N-IN}) \qquad (1)$$

The phase-difference detection circuit 10 adds the first signal $V_{P-IN}$ and the second signal $V_{N-IN}$ to generate the phase difference signal $V_k$, which is an inversion signal of a signal resulting from addition of the first signal $V_{P-IN}$ and the second signal $V_{N-IN}$, and outputs the generated phase difference signal $V_k$ to the correction-signal generation circuit 20.

The correction-signal generation circuit 20 has a correction operational amplifier 21, a first correction resistance element 22, a second correction resistance element 23, a third correction resistance element 24, and a fourth correction resistance element 25. The first correction resistance element 22, the second correction resistance element 23, the third correction resistance element 24, and the fourth correction resistance element 25 have the same resistance value, and in one example, the resistance value of each of the first correction resistance element 22, the second correction resistance element 23, the third correction resistance element 24, and the fourth correction resistance element 25 is 10 kΩ. One end of each of the third correction resistance element 24 and the fourth correction resistance element 25 is connected to a first input terminal of the correction operational amplifier 21, and one end of each of the first correction resistance element 22 and the second correction resistance element 23 is connected to a second input terminal of the correction operational amplifier 21. Another end of the first correction resistance element 22 is connected to ground, and another end of the second correction resistance element 23 is connected to an output terminal of the correction operational amplifier 21. Another end of the third correction resistance element 24 is connected to the first transmission line 131, and another end of the fourth correction resistance element 25 is connected to the output terminal of the detection operational amplifier 11 in the phase-difference detection circuit 10.

The correction-signal generation circuit 20 is a computational-operation circuit that combines the phase difference signal $V_k$ and the first signal $V_{P-IN}$ to generate a correction signal $V_{C-OUT}$, which has an inverted phase of the first signal $V_{P-IN}$. An input impedance of the correction operational amplifier 21 is infinite, and the resistance value of the third correction resistance element 24 and the resistance value of the fourth correction resistance element 25 are the same. Thus, using the first signal $V_{P\text{-}IN}$ and the phase difference signal $V_k$, a correction input signal $V_{C\text{-}IN1}$ input to the first input terminal of the correction operational amplifier 21 is given by:

$$V_{C\text{-}IN1}=(V_{P\text{-}IN}+V_k)/2 \quad (2)$$

On the other hand, an input impedance of the correction operational amplifier 21 is infinite, and the resistance values of the first correction resistance element 22 and the second correction resistance element 23 are the same. Thus, using the correction signal $V_{C\text{-}OUT}$, a second correction input signal $V_{C\text{-}IN2}$ input to the second input terminal of the correction operational amplifier 21 is given by:

$$V_{C\text{-}IN2}=V_{C\text{-}OUT}/2 \quad (3)$$

In addition, since a voltage across the first input terminal and the second input terminal of the correction operational amplifier 21 is zero, the correction input signal $V_{C\text{-}IN1}$ and the second correction input signal $V_{C\text{-}IN2}$ satisfies a relationship given by:

$$V_{C\text{-}IN1}=V_{C\text{-}IN2} \quad (4)$$

Substitution of equation (4) into equations (2) and (3) gives:

$$(V_{P\text{-}N}+V_k)/2=V_{C\text{-}OUT}/2 \quad (5)$$

Substitution of equation (1) into the phase difference signal $V_k$ on the left-hand side of equation (5) gives:

$$(V_{P\text{-}IN}-(V_{P\text{-}IN}+V_{N\text{-}IN}))/2=V_{C\text{-}OUT}/2(V_{P\text{-}IN}-(V_{P\text{-}IN}+V_{N\text{-}IN}))=V_{C\text{-}OUT}-V_{N\text{-}IN}=V_{C\text{-}OUT} \quad (6)$$

Thus, the correction signal $V_{C\text{-}OUT}$ is a signal obtained by inverting the phase of the second signal $V_{N\text{-}IN}$. When the correction signal $V_{C\text{-}OUT}$, which is a signal obtained by inverting the phase of the second signal $V_{N\text{-}IN}$, is used as one signal of the differential signals, and the second signal $V_{N\text{-}IN}$ is used as another signal of the differential signals input to the receiving circuit 121, skew between the differential signals input to the receiving circuit 121 becomes zero.

Figure 3:
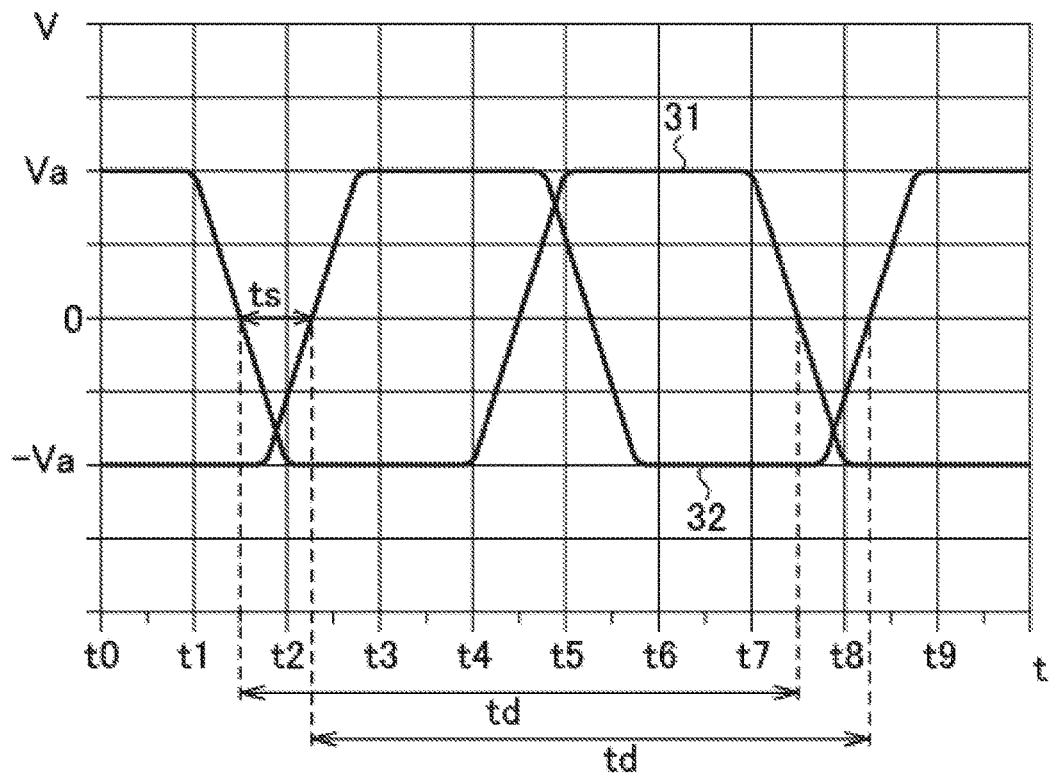
FIG. 3 is a graph illustrating one example of the waveform of a first signal, which is one signal of differential signals input to the skew correction circuit according to the embodiment, and the waveform of a second signal, which is another signal of the differential signals.

FIG. 3 is a graph illustrating one example of the waveform of the first signal $V_{P\text{-}IN}$, which is one signal of the differential signals, and the waveform of the second signal $V_{N\text{-}IN}$, which is the other signal of the differential signals. In FIG. 3, the horizontal axis represents a time between time t0 and time t9, and the vertical axis represents the amplitudes of the first signal $V_{P\text{-}IN}$ and the second signal $V_{N\text{-}IN}$. A waveform 31 represents the waveform of the first signal $V_{P\text{-}IN}$, and a waveform 32 represents the waveform of the second signal $V_{N\text{-}IN}$.

Each of the first signal $V_{P\text{-}IN}$ and the second signal $V_{N\text{-}IN}$ has an amplitude of Va and a cycle of td. Skew ts between the first signal $V_{P\text{-}IN}$ and the second signal $V_{N\text{-}IN}$ is defined by a time difference between a timing at which the first signal $V_{P\text{-}IN}$ becomes zero and a timing at which the second signal $V_{N\text{-}IN}$ becomes zero. In one example, the skew ts between the first signal $V_{P\text{-}IN}$ and the second signal $V_{N\text{-}IN}$ includes a delay difference between the first signal $V_{P\text{-}IN}$ and the second signal $V_{N\text{-}IN}$, the delay difference being caused by a difference between the length of the first transmission line 131 in the transmission path 103 and the length of the second transmission line 132.

Figure 4:
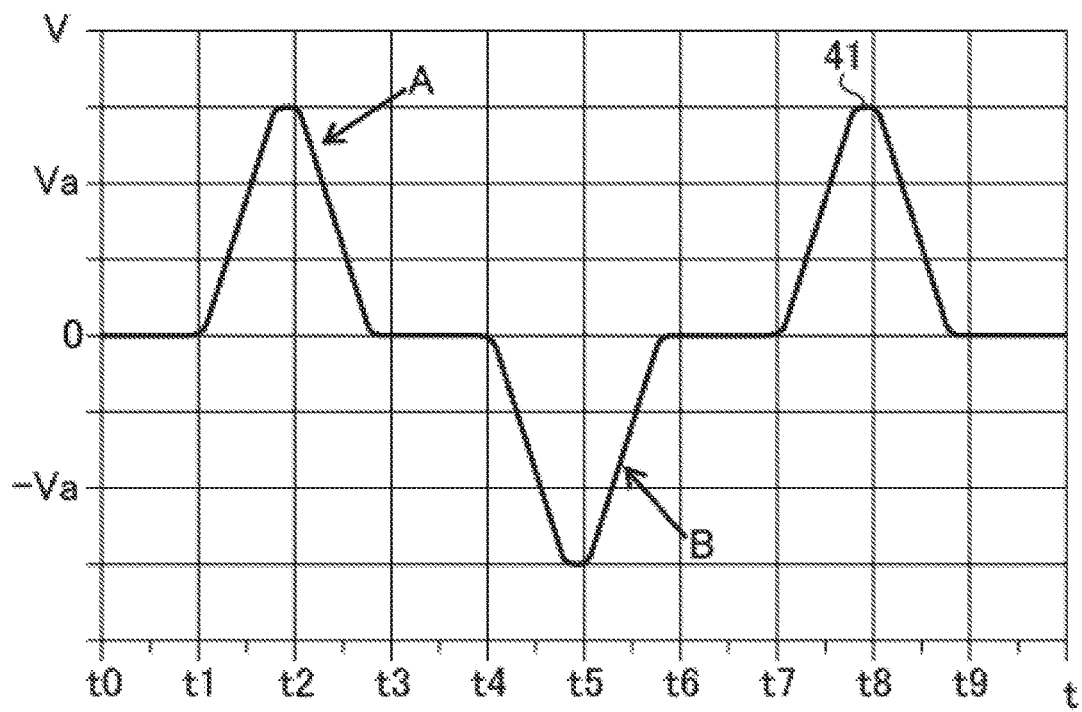
FIG. 4 is a graph illustrating the waveform of a phase difference signal generated by a phase-difference detection circuit illustrated in FIG. 1 when the first signal and the second signal have the respective waveforms illustrated in FIG. 3.

FIG. 4 is a graph illustrating the waveform of the phase difference signal $V_k$ when the first signal $V_{P\text{-}IN}$ and the second signal $V_{N\text{-}IN}$ have the respective waveforms illustrated in FIG. 3. In FIG. 4, the horizontal axis represents time, indicating a period of time between time t0 to t9 corresponding to FIG. 3, and the vertical axis represents the amplitude of the phase difference signal $V_k$. In FIG. 4, a waveform 41 represents the waveform of the phase difference signal $V_k$.

The phase difference signal $V_k$ has a waveform in which a positive pulse wave and a negative pulse wave occur alternately in response to the skew between the first signal $V_{P\text{-}IN}$ and the second signal $V_{N\text{-}IN}$. In FIG. 4, the pulse wave indicated by arrow A at and about time t2 has a positive amplitude as a result of transition of the voltage of the first signal $V_{P\text{-}IN}$ from the positive voltage to the negative voltage and transition of the voltage of the second signal $V_{N\text{-}IN}$ from the negative voltage to the positive voltage. In FIG. 4, the pulse wave indicated by arrow B at and around time t5 has a negative amplitude as a result of transition of the voltage of the first signal $V_{P\text{-}IN}$ from the negative voltage to the positive voltage and transition of the voltage of the second signal $V_{N\text{-}IN}$ from the positive signal to the negative signal.

Figure 5:
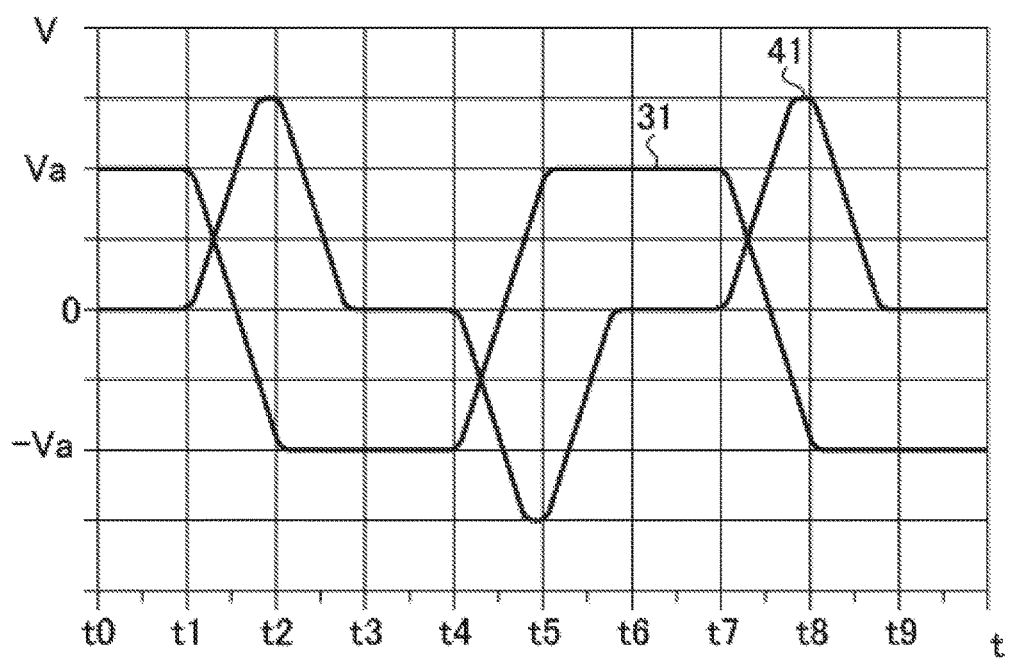
FIG. 5 is a graph illustrating the waveforms of the first signal and the phase difference signal input to the correction-signal generation circuit illustrated in FIG. 1 when the first signal and the second signal have the respective waveforms illustrated in FIG. 3.

FIG. 5 is a graph illustrating the waveforms of the first signal $V_{P\text{-}IN}$ and the phase difference signal $V_k$ input to the correction-signal generation circuit 20 when the first signal $V_{P\text{-}IN}$ and the second signal $V_{N\text{-}IN}$ have the respective waveforms illustrated in FIG. 3. In FIG. 5, the horizontal axis represents time, indicating a period of time between time t0 to t9 corresponding to FIG. 3, and the vertical axis represents the amplitudes of the first signal $V_{P\text{-}IN}$ and the phase difference signal $V_k$. In FIG. 5, a waveform 31 represents the waveform of the first signal $V_{P\text{-}IN}$, and a waveform 41 represents the waveform of the phase difference signal $V_k$.

A combined signal obtained by combining the first signal $V_{P\text{-}IN}$ and the phase difference signal $V_k$ is input to a first terminal of the correction-signal generation circuit 20, and the voltage at a second terminal of the correction-signal generation circuit 20 is the same as the voltage of the combined signal of the first signal $V_{P\text{-}IN}$ and the phase difference signal $V_k$, the combined signal being input to the first terminal.

Figure 6:
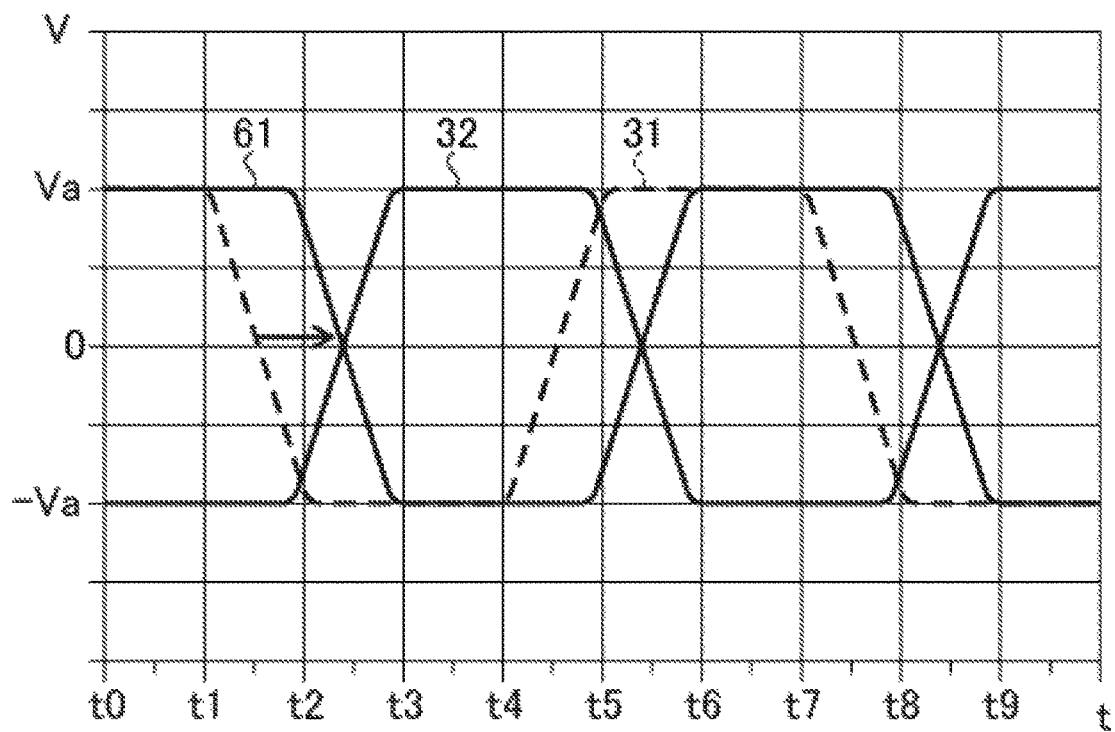
FIG. 6 is a graph illustrating the waveforms of the first signal and the second signal of the differential signals and the waveform of a correction signal generated by the correction-signal generation circuit illustrated in FIG. 1 when the first signal and the second signal have the respective waveforms illustrated in FIG. 3.

FIG. 6 is a graph illustrating the waveforms of the first signal $V_{P\text{-}IN}$ and the second signal $V_{N\text{-}IN}$ and the waveform of the correction signal $V_{C\text{-}OUT}$ generated by the correction-signal generation circuit 20 when the first signal $V_{P\text{-}IN}$ and the second signal $V_{N\text{-}IN}$ have the respective waveforms illustrated in FIG. 3. In FIG. 6, the horizontal axis represents time, indicating a period of time between time t0 to t9 corresponding to FIG. 3, and the vertical axis represents the amplitudes of the first signal $V_{P\text{-}IN}$, the second signal $V_{N\text{-}IN}$, and the correction signal $V_{C\text{-}OUT}$. In FIG. 6, a waveform 31 represents the waveform of the first signal $V_{P\text{-}IN}$, a waveform 32 represents the waveform of the second signal $V_{N\text{-}IN}$, and a waveform 61 represents the waveform of the correction signal $V_{C\text{-}OUT}$.

The correction-signal generation circuit 20 combines the first signal $V_{P\text{-}IN}$ and the phase difference signal $V_k$ indicating the phase difference between the edge of the first signal $V_{P\text{-}IN}$ and the edge of the second signal $V_{N\text{-}IN}$, the phase difference signal $V_k$ being generated by the phase-difference detection circuit 10, to generate the correction signal $V_{C\text{-}OUT}$ having an inverted phase of the second signal $V_{N\text{-}IN}$. Since the correction signal $V_{C\text{-}OUT}$ is a signal having an inverted phase of the second signal $V_{N\text{-}IN}$, the phase difference between the edge of the correction signal $V_{C\text{-}OUT}$ and the edge of the second signal $V_{N\text{-}IN}$ becomes zero. The correction signal $V_{C\text{-}OUT}$ and the second signal $V_{N\text{-}IN}$ between which the edge phase difference is zero are input to the receiving circuit 121 as differential signals.

(Operational Advantages of Skew Correction Circuit According to Embodiment)

The skew correction circuit 1 according to the embodiment combines a phase difference signal, which indicates the phase difference between the edges of differential signals, and one signal of the differential signals to generate a correction signal, which has an inverted phase of another signal of the differential signals, thereby providing differential signals between which the edge phase difference is zero to the receiving circuit 121. Since the skew correction circuit 1 according to the embodiment provides, to the receiving circuit 121, the differential signals between which the edge phase difference is zero and which have no skew, the possibility of erroneous-information communication decreases.

Figure 7:
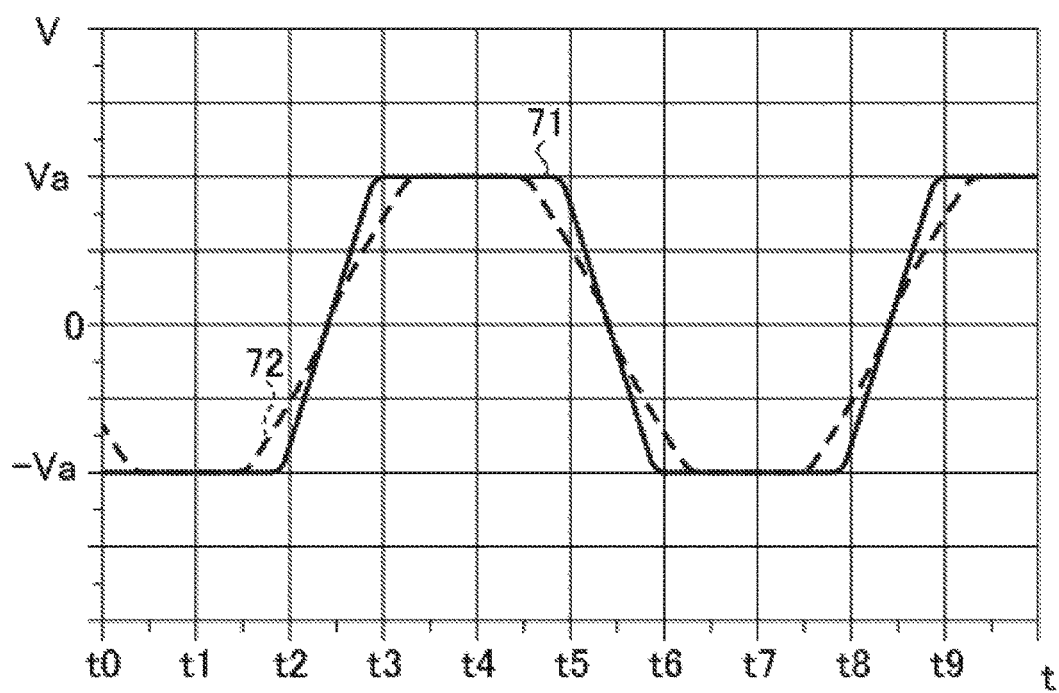
FIG. 7 is a graph illustrating an example of the first signal, which is one signal of the differential signals transmitted to a receiving-end IC through a transmission path illustrated in FIG. 1.

FIG. 7 is a graph illustrating an example of the first signal $V_{P-IN}$, which is one signal of the differential signals transmitted to the receiving-end IC 120 through the transmission path 103. In FIG. 7, the horizontal axis represents time, indicating a period of time between time t0 to t9 corresponding to FIG. 3, and the vertical axis represents the amplitude of the first signal $V_{P-IN}$. In FIG. 7, a waveform 71 represents the waveform of the first signal $V_{P-IN}$ whose rise time and fall time are relatively short, and a waveform 72 represents the waveform of the first signal $V_{P-IN}$ whose rise time and fall time are relatively long.

It is preferable that the first signal $V_{P-IN}$ transition rapidly from high to low or low to high, as indicated by the waveform 71, through reduction of the rise time and the fall time of the first signal $V_{P-IN}$. However, for example, when the distance of the transmission path 103 is large, the rise time and the fall time of the first signal $V_{P-IN}$ increase, as indicated by the waveform 72. When the rise time and the fall time of the first signal $V_{P-IN}$ increase, and there is skew between the positive signal and the negative signal of the differential signals, the eye in the eye pattern of the differential signals closes to thereby deteriorate the quality of the differential signals. The skew correction circuit 1 according to the embodiment provides skew-less differential signals to the receiving circuit 121, thereby making it possible to minimize the deterioration of the quality of the differential signals when the rise time and the fall time of the differential signals increase.

The skew correction circuit 1 according to the embodiment includes the phase-difference detection circuit 10 and the correction-signal generation circuit 20, each including the single operational amplifier and the plurality of resistance elements, as described above. The skew correction circuit 1 according to the embodiment has a simple circuit configuration, compared with a phase correction circuit of the related art which uses a multi-stage gate circuit, a flip-flop circuit, a phase-locked loop circuit, an integration circuit, or the like.

Additionally, since the skew correction circuit 1 according to the embodiment may provide skew-less differential signals to the receiving circuit, the delay time between the positive signal and the negative signal of the differential signals may be adjusted without using a meander wire.

Figure 8A:
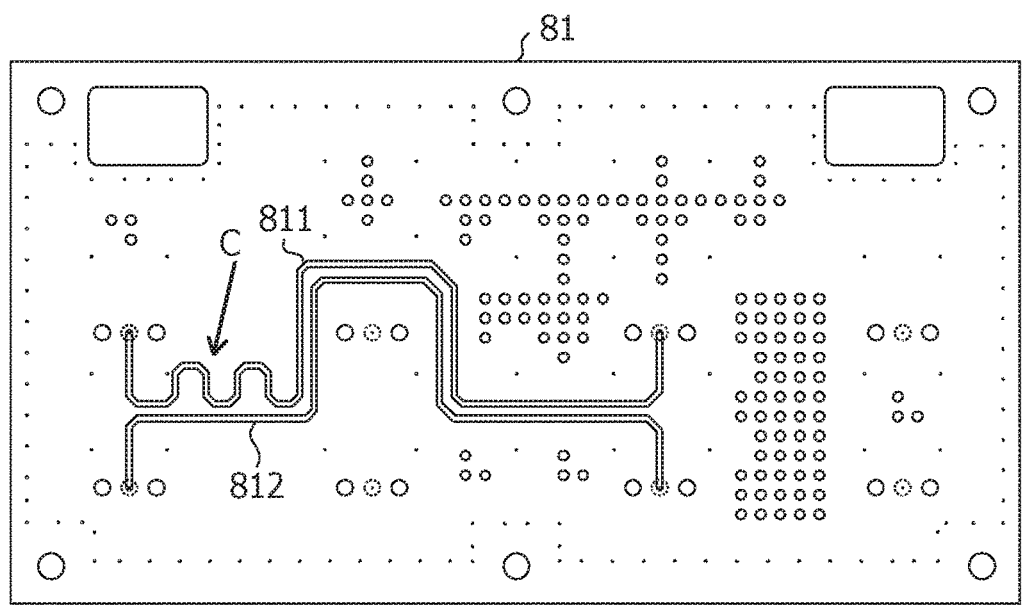
FIG. 8A is a diagram illustrating an example of a substrate for adjusting a delay time between a positive signal and a negative signal of differential signals by using a meander wire.
Figure 8B:
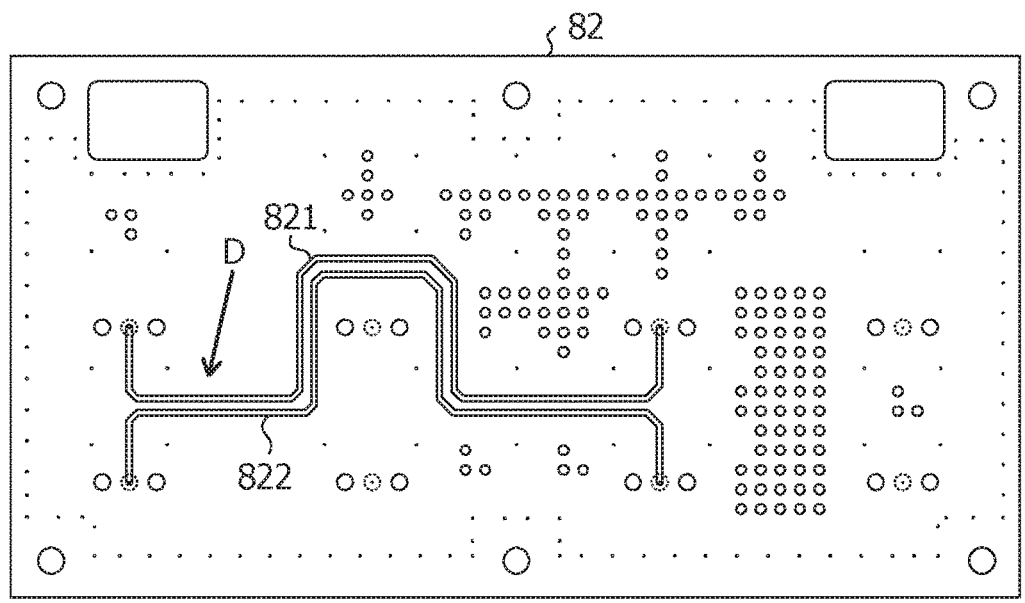
FIG. 8B is a diagram illustrating an example of a substrate for adjusting the delay time between the positive signal and the negative signal of the differential signals without using a meander wire.

FIG. 8A is a diagram illustrating an example of a substrate for adjusting the delay time between the positive signal and the negative signal of the differential signals by using a meander wire, and FIG. 8B is a diagram illustrating an example of a substrate for adjusting the delay time between the positive signal and the negative signal of the differential signals without using a meander wire.

A substrate 81 has a first wire 811 through which one signal of the differential signals is transmitted and a second wire 812 through which another signal of the differential signals is transmitted. As indicated by arrow C, the first wire 811 has a meander wire formed in order to adjust the delay time.

A substrate 82 has a first wire 821 through which one signal of the differential signals is transmitted and a second wire 822 through which another signal of the differential signals is transmitted. The first wire 821 has no meander wire for adjusting the delay time, as indicated by arrow D, and the area in which no meander wire is generated on the substrate 82 is usable for arrangement of another wire or element.

(Modification of Skew Correction Circuit According to Embodiment)

Although the skew correction circuit 1 is used to correct skew between the differential signals received by the receiving circuit 121 in the communication system 100, the skew correction circuit 1 may also be used to correct skew between other differential signals, such as differential signals in an LSI circuit.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A skew correction circuit comprising:
   a phase-difference detection circuit that generates a phase difference signal indicating a phase difference between an edge of a first signal that is one signal of differential signals and an edge of a second signal that is another signal of the differential signals; and
   a correction-signal generation circuit that generates a correction signal having an inverted phase of the second signal by combining the phase difference signal and the first signal.

2. The skew correction circuit according to claim 1, wherein the phase-difference detection circuit includes a detection operational amplifier having a first input terminal coupled to ground, a second input terminal to which the first signal and the second signal are input, and an output terminal that is coupled to the second input terminal and outputs the phase difference signal.

3. The skew correction circuit according to claim 1, wherein the correction-signal generation circuit includes a correction operational amplifier having a first input terminal to which the first signal and the phase difference signal are input, a second input terminal to which one end of a first correction resistance element is coupled, and an output terminal to which one end of a second correction resistance element having a resistance value that is equal to a resistance value of the first correction resistance element is coupled, another end of the first correction resistance element being coupled to ground, and another end of the second correction resistance element being coupled to the second input terminal.

4. An electronic device comprising:
- a skew correction circuit that corrects skew between differential signals transmitted through a transmission path; and
- a receiving circuit that receives the differential signals between which the skew is corrected by the skew correction circuit, and wherein the skew correction circuit includes:
- a phase-difference detection circuit that generates a phase difference signal indicating a phase difference between an edge of a first signal that is one signal of the differential signals and an edge of a second signal that is another signal of the differential signals; and
- a correction-signal generation circuit that generates a correction signal having an inverted phase of the second signal by combining the phase difference signal and the first signal.

5. A skew correction method comprising:
- generating a phase difference signal indicating a phase difference between an edge of a first signal that is one signal of differential signals and an edge of a second signal that is another signal of the differential signals; and
- generating a correction signal having an inverted phase of the second signal by combining the phase difference signal and the first signal.

* * * * *